United States Patent [19]

Oetzmann

[11] Patent Number: 4,866,384
[45] Date of Patent: Sep. 12, 1989

[54] RELATIVE PHASE MAGNETIC FIELD DIRECTION INDICATING DEVICES USEFUL AS COMPASSES

[75] Inventor: Emerson H. Oetzmann, Ashford, England

[73] Assignee: Gec-Marconi Limited, England

[21] Appl. No.: 48,247

[22] Filed: May 11, 1987

[30] Foreign Application Priority Data

May 21, 1986 [GB] United Kingdom ............... 8612351

[51] Int. Cl.$^4$ .............................................. G01R 33/02
[52] U.S. Cl. ...................................... 324/244; 33/361;
                                              324/209; 324/260
[58] Field of Search ........................... 324/207–209,
        324/, 226, 225, 233, 248, 249, 260, 261, 262,
        263, 56, 259; 33/361, 362, 356; 310/26, 328, 364

[56] References Cited

U.S. PATENT DOCUMENTS

| | | | |
|---|---|---|---|
| 2,334,593 | 11/1943 | Wyckoff | 324/209 X |
| 2,474,693 | 6/1949 | Rowe | 324/209 X |
| 3,909,809 | 9/1975 | Kinsner et al. | 340/174 TF |
| 3,959,889 | 6/1976 | Thomas | 33/361 |
| 4,030,204 | 6/1977 | Edwards | 33/361 |
| 4,267,640 | 5/1981 | Wu | 33/361 |
| 4,429,469 | 2/1984 | Tsushima et al. | 33/361 |
| 4,443,731 | 4/1984 | Butler et al. | 310/328 X |
| 4,462,165 | 7/1984 | Lewis | 33/361 |
| 4,564,289 | 1/1986 | Spillman, Jr. | 324/244 X |
| 4,587,487 | 5/1986 | Zanzucchi | 324/244 |

FOREIGN PATENT DOCUMENTS

| | | | |
|---|---|---|---|
| 58-165071 | 9/1983 | Japan | 324/244 |
| 709528 | 5/1954 | United Kingdom | 324/209 |
| 1388337 | 3/1975 | United Kingdom . | |
| 1437068 | 5/1976 | United Kingdom . | |
| 1565188 | 4/1980 | United Kingdom . | |
| 2188157 | 9/1987 | United Kingdom | 324/209 |

OTHER PUBLICATIONS

Electronic Letters, vol. 22, No. 14, Jul. 3, 1986, pp. 737–738, article by A. Pantinakis et al., entitled "High sensitivity low-frequency magnetometer using magnetostrictive primary sensing and piezoelectric signal recovery".

Primary Examiner—Reinhard J. Eisenzopf
Assistant Examiner—Warren S. Edmonds
Attorney, Agent, or Firm—Kirschstein, Ottinger, Israel & Schiffmiller

[57] ABSTRACT

An applied magnetic field direction indicating device comprising a magnetic sensor (1) having an omnidirectional characteristic and an output which is non-linearly related to the magnitude of the applied field. The sensor (1) is subjected to two mutually perpendicular sinusoidal magnetic biasing fields of the same frequency and in time quadrature relationship. A characteristic of the output of the sensor (1) is indicative of the direction of the applied field.

8 Claims, 2 Drawing Sheets

RELATIVE PHASE MAGNETIC FIELD DIRECTION INDICATING DEVICES USEFUL AS COMPASSES

BACKGROUND OF THE INVENTION

Field of the Invention

This invention relates to devices for indicating the direction of a magnetic field.

SUMMARY OF THE INVENTION

It is an object of the present invention to provide such a device having no moving parts.

According to the present invention there is provided a device for indicating the direction of an applied magnetic field comprising: a magnetic sensor exhibiting an omnidirectional directional characteristic and producing an output which is non-linearly related to the magnitude of the applied magnetic field; and means for subjecting said sensor to mutually perpendicular sinusoidal magnetic biassing fields of the same frequency in time quadrature relationship, whereby the output of said sensor includes a component at the frequency of said biassing fields whose phase relative to said biassing fields indicates the direction of said applied magnetic field relative to a reference direction.

Preferably said sensor comprises at least one member of magnetostrictive material and transducer means responsive to deformation of said magnetostrictive member to produce said output.

BRIEF DESCRIPTION OF THE DRAWINGS

One device in accordance with the invention will now be described by way of example with reference to the accompanying drawings of which.

DETAILED DESCRIPTION OF THE PREFERRED EMBODIMENT

Figure 1:
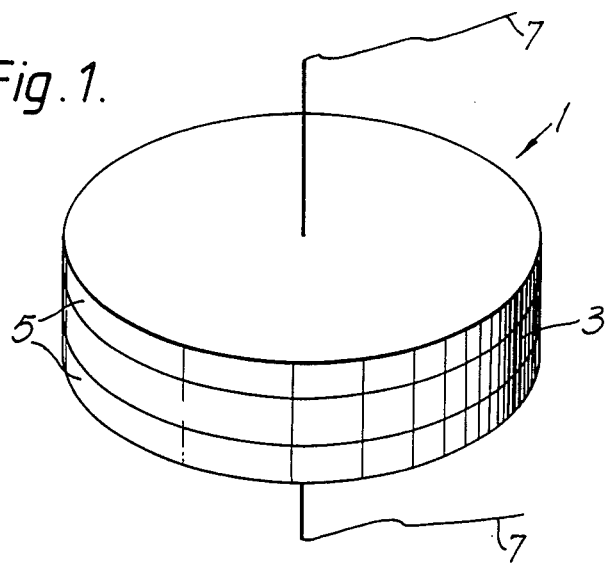
FIG. 1 shows a perspective view of a magnetic sensor forming part of the device.

Referring to FIG. 1 the device includes a magnetic sensor 1 of a kind forming the subject of United Kingdom patent application No.: 8705449 (now G.B. No. 2188157A). The sensor 1 comprises a planar circular disc of piezoelectric material 3 sandwiched between two planar circular discs of electrically conductive magnetostrictive material 5. The two discs 5 have the same radial dimensions as the disc 3 and are positioned on the opposite main surfaces of the disc 3, in register with the disc 3. The disc 3 is polarised so that when subject to compression or tension in any direction parallel to its main surfaces it will generate a potential difference between its main surfaces. The two discs 5 also serve as electrodes of the sensor 1 and are provided with leads 7.

When the magnetic sensor 1 is subjected to a magnetic field directed parallel to its plane the discs 5 will expand in the direction of the applied field and consequently stretch the disc 3 in the same direction. A dc potential difference is consequently generated between the main surfaces of the disc 3 whose value is representative of the strength of the applied field. This potential difference may thus be applied to an electric circuit via the leads 7.

It will be appreciated that the sensor exhibits the same sensitivity in all directions parallel to its plane and thus exhibits an omnidirectional characteristic in this plane.

Figure 3:
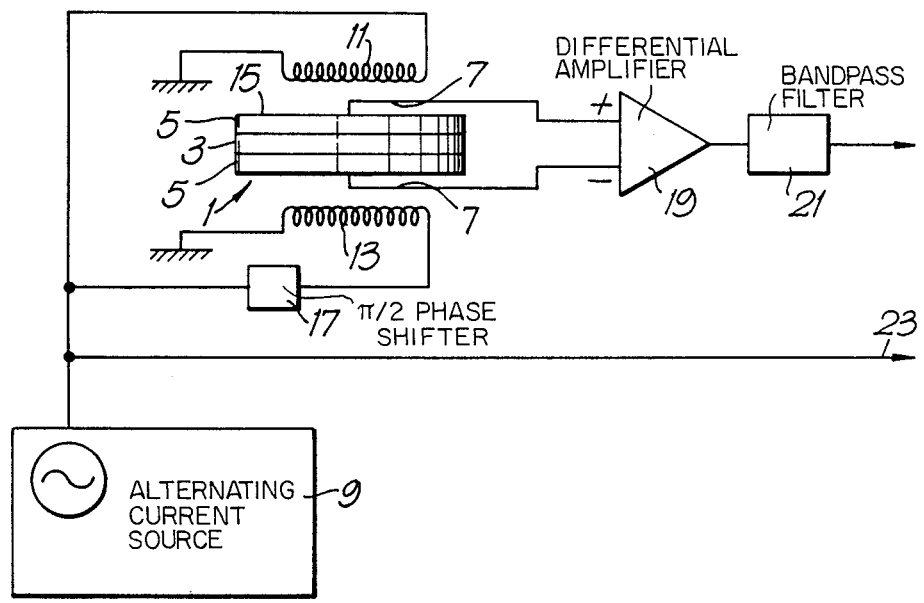
FIG. 3 is a schematic diagram of the whole of the device.
Figure 2:
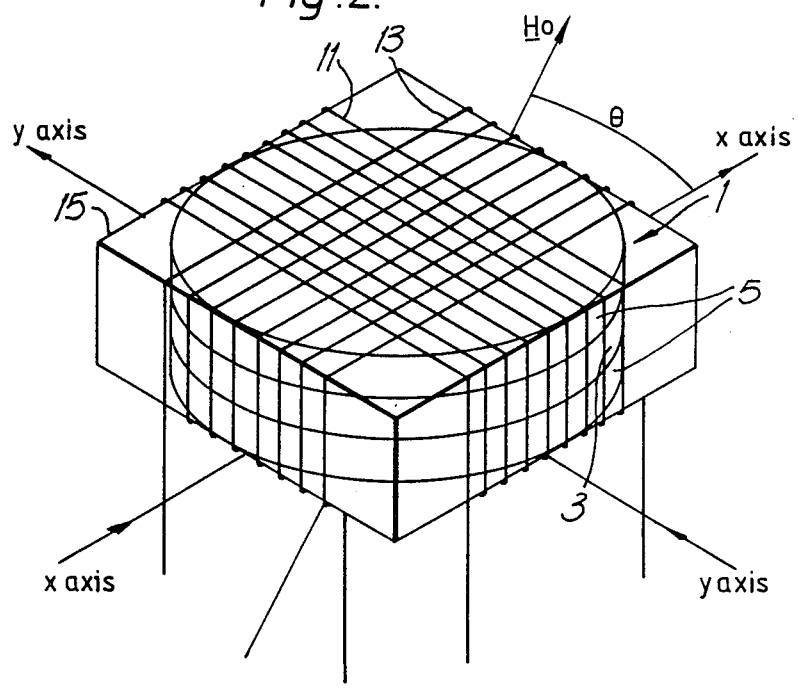
FIG. 2 is a perspective view of part of the device.

Referring to FIGS. 2 and 3, the magnetic sensor 1 is subjected to a magnetic biassing field produced by an alternating current fed by a reference frequency generator 9 to two coils 11, 13 having the same dimensions and wound around a rectangular former 15 containing the sensor 1 so that the magnetic axes of the coils 11, 13 are perpendicular and lie in the plane of the sensor 1.

The phase of the alernating current fed to the coil 13 is arranged to be out of phase by $\pi/2$ with the alternating current fed to the coil 11. This is effected by the presence of the $\pi/2$ phase shifter 17. The voltage between the leads 7 is fed via a differential amplifier 19 to a bandpass filter 21. As explained below, in operation the output of the bandpass filter 21 comprises a phase shifted carrier at the same frequency as the reference frequency generator 9, amplitude modulated by a magnetic field applied to the sensor whose direction is to be determined.

The operation of the device when used as a magnetic compass to determine the direction of the magnetic meridian will now be explained in detail. For such the sensor 1 is placed with its plane horizontal.

Figure 4:
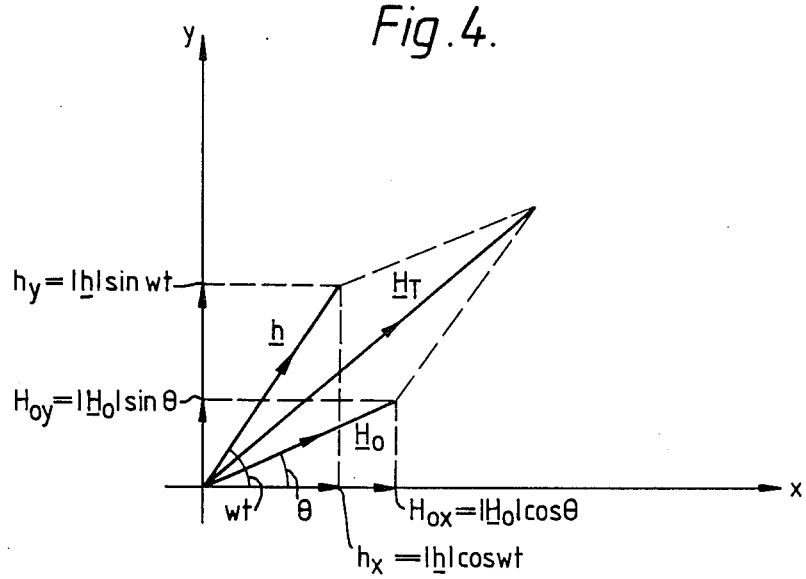
FIG. 4 is vector diagram of magnetic fields in the region of the magnetic sensor in operation.

Referring to FIG. 4, at any instant the total magnetic field $\underline{H}_T$ in the region of the plane of the sensor 1 will comprise a component $\underline{H}_o$ due to the horizontal component of the earth's magnetic field and a component $\underline{h}$ due to the alternating currents fed to the coils 11, 13. It may be therefore be written $$\underline{H}_T = \underline{H}_o + \underline{h} \qquad (1)$$

The components $\underline{H}_o$, $\underline{h}$ may each be resolved into two components in the x and y directions respectively:

$$\underline{H}_o = \underline{H}_{ox} + \underline{H}_{oy} = |\underline{H}_o| \cos\theta + |\underline{H}_o| \sin\theta \qquad (2)$$

and:

$$\underline{h} = \underline{h}_x + \underline{h}_y = |\underline{h}| \cos wt + |\underline{h}| \sin wt \qquad (3)$$

where
 $H_{ox}$ is the sub-component of $\underline{H}_o$ in the x direction;
 $\overline{H}_{oy}$ is the sub-component of $\overline{H}_o$ in the y direction;
 $\underline{h}_x$ is the sub-component of $\underline{h}$ in the x direction,
 $\underline{h}_y$ is the sub-component of $\underline{h}$ in the y direction;
 $\theta$ is the angle between the vector $\underline{H}_o$ and the x-axis;
 $wt$ is the angle between the vector $\underline{h}$ and the x-axis;
 $|\underline{H}_o|$ is the modulus or magnitude of the vector $\underline{H}_o$; and
 $|\underline{h}|$ is the modulus or magnitude of the vector $\underline{h}$.

Substituting the results of equations (2) and (3) in equation (1):

$$\underline{H}_T = |\underline{H}_o| \cos\theta + |\underline{H}_o| \sin\theta + |\underline{h}| \cos wt + |\underline{h}| \sin wt$$

$$\underline{H}_T = |\underline{H}_o| \cos\theta + |\underline{h}| \cos wt + |\underline{H}_o| \sin\theta + |\underline{h}| \sin wt$$

Therefore:

$$|\underline{H}_T|^2 = (|\underline{H}_o| \cos\theta + |\underline{h}| \cos wt)^2 + (|\underline{H}_o| \sin\theta + |\underline{h}| \sin wt)^2 \qquad (4)$$

The magnitude of the potential difference generated between the leads 7, is proportional to the magnetostrictive expansion of the discs 5. The magnetostrictive expansion of the discs 5 is proportional to the square of the magnitude of the magnetic field in the region of the sensor. It may therefore be written:

$$|V| = k|\underline{H}_T|^2 \tag{5}$$

where V is the potential difference between the leads 7; and k is a constant of proportionality dependent upon the sensitivity of the matrials used to fabricate the sensor 1.

From equations (4) and (5):

$$\frac{|V|}{k} = (|\underline{H}_o|\cos\theta + |\underline{h}|\cos wt)^2 + (|\underline{H}_o|\sin\theta + |\underline{h}|\sin wt)^2 \tag{6}$$

$$\frac{|V|}{k} = |\underline{H}_o|^2 \cos^2\theta + |\underline{h}|^2 \cos^2 wt +$$
$$2|\underline{H}_o||\underline{h}|\cos\theta\cos wt + |\underline{H}_o|^2 \sin^2\theta + |\underline{h}|^2 \sin^2 wt +$$
$$2|\underline{H}_o||\underline{h}|\sin\theta\sin wt$$

$$\frac{|V|}{k} = |\underline{H}_o|^2 + |\underline{h}|^2 + 2|\underline{H}_o||\underline{h}|\cos(wt-\theta)$$

$$|V| = k|\underline{H}_o|^2 + k|\underline{h}|^2 + 2k|\underline{H}_o||\underline{h}|\cos(wt-\theta)$$

In equation (6) $k|\underline{H}_o|^2$ and $k|\underline{h}|^2$ are dc terms and will therefore be filtered out by the bandpass filter 21. The output $V_{out}$ of the bandpass filter 21 will therefore be given by:

$$V_{out} = 2k|\underline{H}_o||\underline{h}|\cos(wt-\theta) \tag{7}$$

From equation (7) it can be seen that $V_{out}$ has an amplitude proportioned to the magnitude $|\underline{H}_o|$ of the horizontal component of the earth's magnetic field in the region of the sensor 1 and a phase shift $\theta$ with respect to the phase of the biassing alternating current applied to coil 11 (the coil 11 producing the component $h_x = |\underline{h}|\cos wt$ of the biassing magnetic field, as shown in FIGS. 2 and 4). This phase shift $\theta$ is equal to the bearing of magnetic north from the direction of the axis of the coil 11. The phase shift may be detected by utilising the output of the bandpass filter 21 and a phase reference signal 23, obtained from the reference frequency generator 9, in a phase detector or phase and gain meter (not shown).

It will be appreciated that whilst in the embodiment of the invention described by way of example the relationship defined in equation (5) is a square relationship, in other embodiments this relationship may be any other non-linear relationship such that the output voltage of the sensor contains a $\cos(wt-\theta)$ term.

In the particular embodiment described by way of example, this relationship exists by virtue of the fact that the applied magnetic field is non-linearly related to the radial deformation of the magnetostrictive discs 5 and an output voltage proportional to the deformation is produced by a transducer means constituted by the piezoelectric disc 3. However, in other devices according to the invention alternative forms of transducer means may be used.

For example, a fibre-optic measurement technique may be used wherein the transducer means comprises one or more turns of optical fibre wound around and bound to the circumference of a disc of magnetostrictive material. Upon radial deformation of the disc the circumference of the disc varies proportionally thus stretching the optical fibre.

Accurate detection of the change in length of the optical fibre can be carried out by making the optical fibre one arm of an interferometer (for example a Mach-Zehnder interferometer). The output of the interferometer will be of the form $H_o \cos(wt-\theta)$.

Another alternative form of transducer means for measuring the deformation of a magnetostrictive disc is a strain-gauge having its resistive element wound around, but insulated from, the circumference of the disc.

It is further pointed out that in devices in accordance with the invention wherein the magnetic sensor comprises at least one member of magnetrostrictive material and transducer means responsive to deformation of the magnetostrictive member, the or each magnetostrictive member is not necessarily in the form of a disc, as in the embodiment described by way of example. For example, the or each magnetostrictive member may alternatively be of annular form.

I claim:

1. A device for indicating the direction of an applied magnetic field to which the device is subject, comprising: a magnetic sensor exhibiting, in at least one plane, the same sensitivity in all directions and producing an output which is non-linearly related to the magnitude of the applied magnetic field; and means for subjecting said sensor to mutually perpendicular sinusoidal magnetic biassing fields of the same frequency in time quadrature relationship, said output of said sensor including a component at said frequency of said biassing fields, said component having a phase relative to said biassing fields which indicates the direction of said applied magnetic field relative to a reference direction.

2. A device according to claim 1 wherein said sensor comprises at least one member of magnetostrictive material; and transducer means secured to said at least one magnetostrictive member so as to be responsive to deformation of said at least one magnetostrictive member to produce said output.

3. A device according to claim 2 wherein said transducer means is made of piezoelectric material.

4. A device according to claim 3 wherein said at least one member of magnetostrictive material is secured to a first surface of said piezoelectric transducer means; and said output of said sensor is derived from between said first surface and a second surface of said piezoelectric transducer means opposite said first surface.

5. A device according to claim 4 wherein a second member of magnetostrictive material is secured to said second surface.

6. A device according to claim 5 wherein said members of magnetostrictive material and said transducer means are of planar disc form and are secured to one another in parallel relationship.

7. A device according to claim 2 wherein said at least one member of magnetostrictive material consists of an electrically conductive material and serves as an electrode for said sensor.

8. A device according to claim 1 wherein said means for subjecting said sensor comprises two electric coils wound around said sensor with their axes mutually perpendicular.

* * * * *